United States Patent [19]

Takeda et al.

[11] Patent Number: 4,583,056
[45] Date of Patent: Apr. 15, 1986

[54] APPARATUS HAVING PRINTED CIRCUIT PATTERN FOR SUPPRESSING RADIO INTERFERENCE

[75] Inventors: Masaaki Takeda; Yasutoshi Kawaguchi, both of Osaka, Japan

[73] Assignee: Matsushita Seiko Co., Ltd., Japan

[21] Appl. No.: 650,673

[22] Filed: Sep. 13, 1984

[51] Int. Cl.$^4$ ............................. H03B 5/36; H05K 9/00
[52] U.S. Cl. ........................................ 331/67; 239/102; 310/317; 331/68; 331/116 R; 361/424
[58] Field of Search ........................ 331/67, 116 R, 68; 310/317, 328, 329; 361/399, 424; 307/91; 239/102

[56] References Cited

U.S. PATENT DOCUMENTS 3,989,042  11/1976  Mitsui et al. ................... 331/116 R
4,338,576  7/1982  Takahashi et al. .................... 331/67

*Primary Examiner*—Siegfried H. Grimm
*Attorney, Agent, or Firm*—Lowe, Price, LeBlanc, Becker & Shur

[57] ABSTRACT

In an apparatus having an insulative substrate, a power circuit is mounted on one surface of the substrate and connected to receive power from a mains supply for rectifying the AC energy of the supply and supplying the rectified energy to a pair of power lines. A high frequency source is mounted on the same surface as the power circuit and electrically connected to the power lines for converting the rectified energy into oscillation energy. A shield casing, which is electrically connected to one of the power lines which is lower in impedance than the other, encases the high frequency source. A conductor, printed on the other surface of the substrate, is substantially aligned with a portion of the shield casing which is positioned between the power circuit and the high frequency source, the conductor being electrically connected to the power line having the lower impedance to suppress radiation which would otherwise leak through a gap between the shield casing and the substrate.

14 Claims, 6 Drawing Figures

4,583,056

APPARATUS HAVING PRINTED CIRCUIT PATTERN FOR SUPPRESSING RADIO INTERFERENCE

BACKGROUND OF THE INVENTION

The present invention relates generally to reduction of radio interference, and more specifically to a noise-suppressed ultrasonic liquid atomizer.

In conventional apparatus having a high frequency oscillator, it is the usual practice to employ a shielding case for shielding the oscillator to prevent it from causing line noise in the mains supply or radiation noise in adjacent electrical appliances. However, radiation easily leaks through a gap between the lower edge of the shield and the substrate's surface. In cases where the shield is provided for certain circuit components while the remainder is exposed, the edge of the shield rides on lead wires that interconnect the shielded and non-shielded components, tending to increase the gap.

SUMMARY OF THE INVENTION

It is therefore an object of the present invention to provide an apparatus having an oscillator in which unwanted radiation is suppressed in a simple manner.

Another object of the present invention is to provide an apparatus having an oscillator in which unwanted radiation is suppressed by a printed conductor substantially aligned with an edge of a shield casing.

A further object of the invention is to provide an apparatus having an oscillator mounted on a printed circuit board in which part of the printed circuit pattern is utilized to suppress radiation which would otherwise leak through a gap between a shield and the printed circuit board.

A still further object of the present invention is to provide an apparatus comprising an insulative substrate, a power circuit mounted on one surface of the substrate and connected to receive power from a mains supply and rectifying the AC energy of the supply and supplying the rectified energy to a pair of power lines, a high frequency source mounted on said one surface of the substrate and electrically connected to the power lines for converting the rectified energy into oscillation energy, and a shield casing electrically connected to one of the power lines which is lower in impedance than the other power line and encasing the high frequency source. Further provided is a conductor printed on the other surface of the substrate and substantially aligned with a portion of the shield casing which is positioned between the power circuit and the high frequency source, the conductor being electrically connected to the one of the power lines to suppress radiation which would otherwise leak through a gap between the shield casing and the substrate.

In a preferred embodiment, the printed conductor is in the shape of a loop encircling a portion of the substrate in which said high frequency source is located.

BRIEF DESCRIPTION OF THE DRAWINGS

The present invention will be described in further detail with reference to the accompanying drawings, in which.

DETAILED DESCRIPTION

Figure 1:
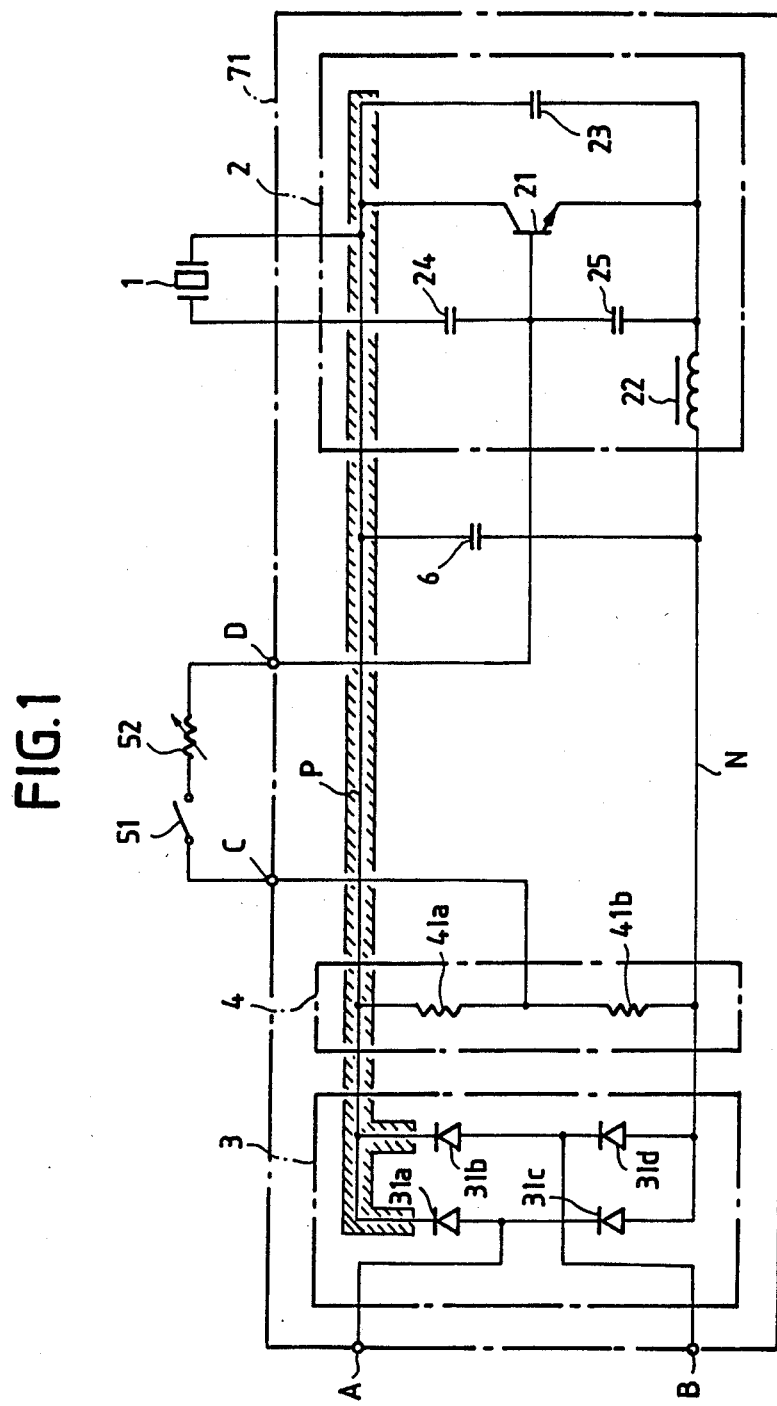
FIG. 1 is a circuit diagram of an atomizer embodying the present invention.

In FIG. 1, an AC voltage of 40 to 60 volts is applied to power input terminals A and B of an atomizer drive circuit embodying the present invention. A full-wave rectifier 3 with diodes 31a, 31b, 31c and 31d are connected in a bridge circuit to input terminals A and B to convert the AC voltage to full-wave rectified non-filtered sinusoidal waves which are fed to positive and negative power lines P and N. A transistor bias voltage is derived from the full-wave rectified output by a voltage divider or bias circuit 4 having resistors 41a and 41b connected in series across the power lines. The bias voltage appears at the junction between resistors 41a and 41b and is applied through a terminal C, a liquid level sensing switch 51, a variable resistor 52, a terminal D to the base of a power transistor 21 which forms part of a Colpitts oscillator 2.

In the illustrated embodiment, transistor 21 has its collector coupled to positive power line P and its emitter coupled to negative power line N. A coil 22 is connected in negative power line N and a capacitor 23 connected across the collector and emitter of transistor 21 to present a parallel resonance load to the transistor 21. Because of the common collector transistor, positive power line P has a lower impedance than negative power line N and can be treated as having a ground potential. A piezoelectric transducer 1, which also acts as an inductive element of the oscillator, is connected in series with a DC decoupling capacitor 24 in a positive feedback path connected from the collector of transistor 21 to its base. The amount of positive feedback and hence the level of high frequency oscillation is determined by an AC coupling capacitor 25. A noise suppression capacitor 6 is connected at one end to positive line P and at the other end to negative line N at a point between bias circuit 4 and coil 22. As illustrated, oscillator 2, rectifier 3, bias circuit 4 and capacitor 6 are all mounted on a common printed-circuit board 71. Of particular importance is the positive power line formed by a conductive strip which is configured in a manner as will be described below.

Figure 2:
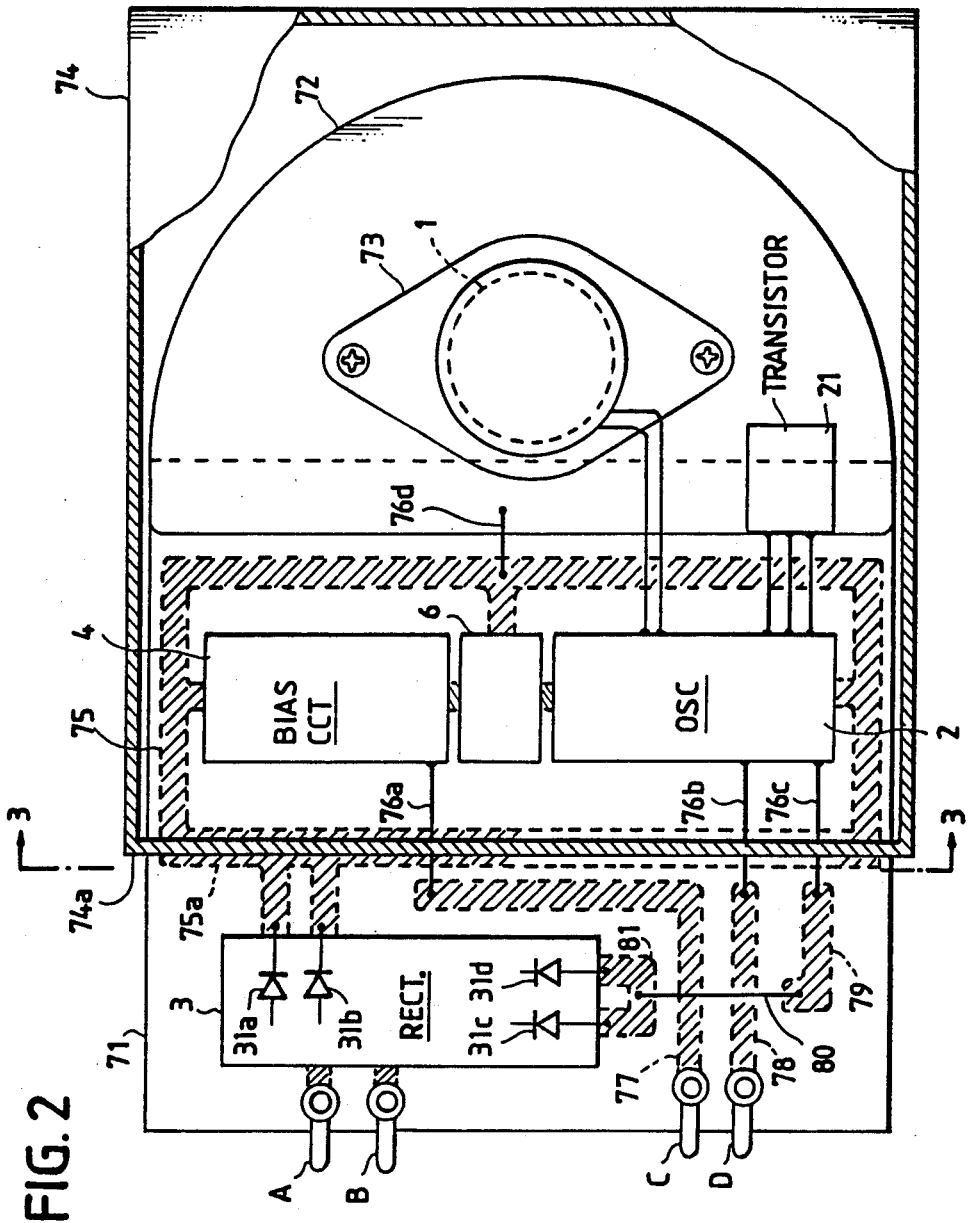
FIG. 2 is a plan view of an atomizer drive circuit.

In FIG. 2, the print circuit is formed on the lower side of substrate 71 and marked by dotted lines with hatchings and the circuit components are mounted on the upper side of the substrate. The positive power line P is formed by a conductive strip 75 which, in a preferred embodiment, is looped around bias circuit 4, capacitor 6 and oscillator 2 and connected as a common ground to these circuits and to the cathode terminals of rectifier diodes 31a and 31b. The junction between resistors 41a, 41b of bias circuit 4 is connected by a connecting lead or jumper 76a to a conductive strip 77 and thence to terminal C. A jumper 76b connects the base of transistor 21 to a strip 78 and thence to terminal D and a jumper 76c connects the negative power line to a strip 79 which is connected by a jumper 80 to a strip 81 to which the anode terminals of rectifier diodes 31c and 31d are connected. To the right side edge of printed circuit board 71 is secured a semicircular conductive base 72 as an extension of the board 71 for mounting transistor 21 and a transducer housing 73. Base 72 is electrically connected to positive power line conductor 75 by a jumper 76d to maintain it at the ground potential for noise reduction purposes.

Figure 3:
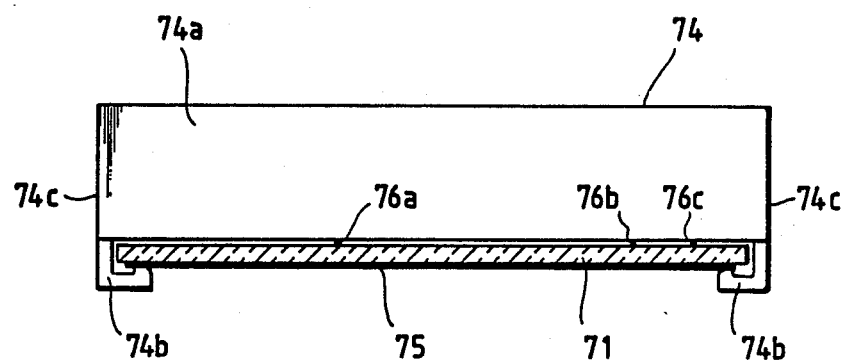
FIG. 3 is a cross-sectional view taken along the line 3—3 of FIG. 2.

The area of printed circuit board 71 and extension 72 is divided into a first portion on which the rectifier circuit 3 is mounted and a second portion on which the remainder of the components are mounted. A shield casing 74 is provided to cover the second portion so that an end wall 74a of shield casing 74 is aligned with a portion 75a of conductive strip 75. As seen in FIG. 3, casing 74 is formed with a pair of inwardly turned guide edges 74b which are extensions of side walls 74c to permit casing 74 to be slid along the opposite edges of the printed circuit board. Guide edges 74b are in electrical contact with the printed conductor 75 to maintain the shield at common ground potential.

The lower edge of the shield's end wall 74a is inevitably spaced from the upper surface of printed circuit board 71 as seen in FIG. 3 and electromagnetic radiation generated by the oscillator would normally tend to leak through the gap to the outside and interfere with the rectifier 3, introducing noise in the mains.

According to a feature of the present invention, high frequency radiation which would otherwise leak through the gap couples with the grounded strip portion 75a and no or little radiation is coupled with rectifier circuit 3.

Figure 4:
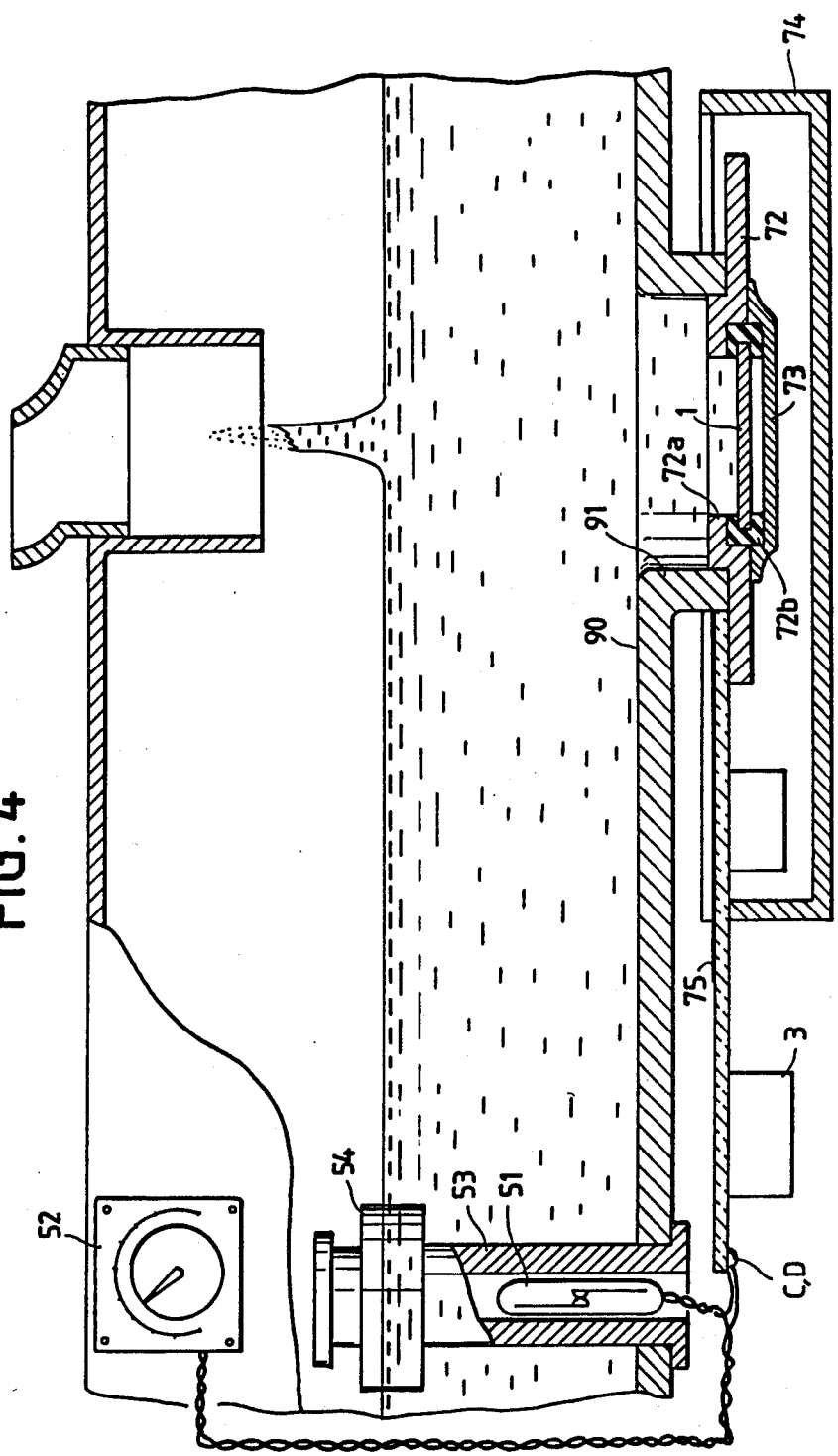
FIG. 4 is a view in cross-section of an atomizer unit incorporating the circuit of FIG. 2.

The atomizer drive circuit is mounted on an atomizer unit as shown in FIG. 4. The atomizer unit comprises a liquid chamber with a base 90 in which an opening 91 is formed. Transducer base 72 is formed with an opening 72a whose edge is raised to engage with opening 91. Piezoelectric transducer 1 is mounted by an annular shaped elastic support 72b which is sandwiched between base 72 and casing 73 so that transducer 1 is in pressure transmitting relation with liquid in the atomizer chamber. Liquid level sensing switch 51 is a reed switch located in a cylinder 53 around which a ring magnet 54 is disposed. Magnet 54 floats on the surface of the liquid. When it slides down to a lower position as the liquid is depleted, magnet 54 will cause the switch 51 to open the connection between the bias circuit to the base of transistor 21 to prevent the transducer 1 from being overloaded. Variable resistor 52 is in circuit with the switch 51 and mounted on a side wall of the atomizer convenient for oscillation level adjustment. In this embodiment, heat generated by transistor 21 is dissipated through metal base 72 which is cooled down by the liquid.

Figure 5:
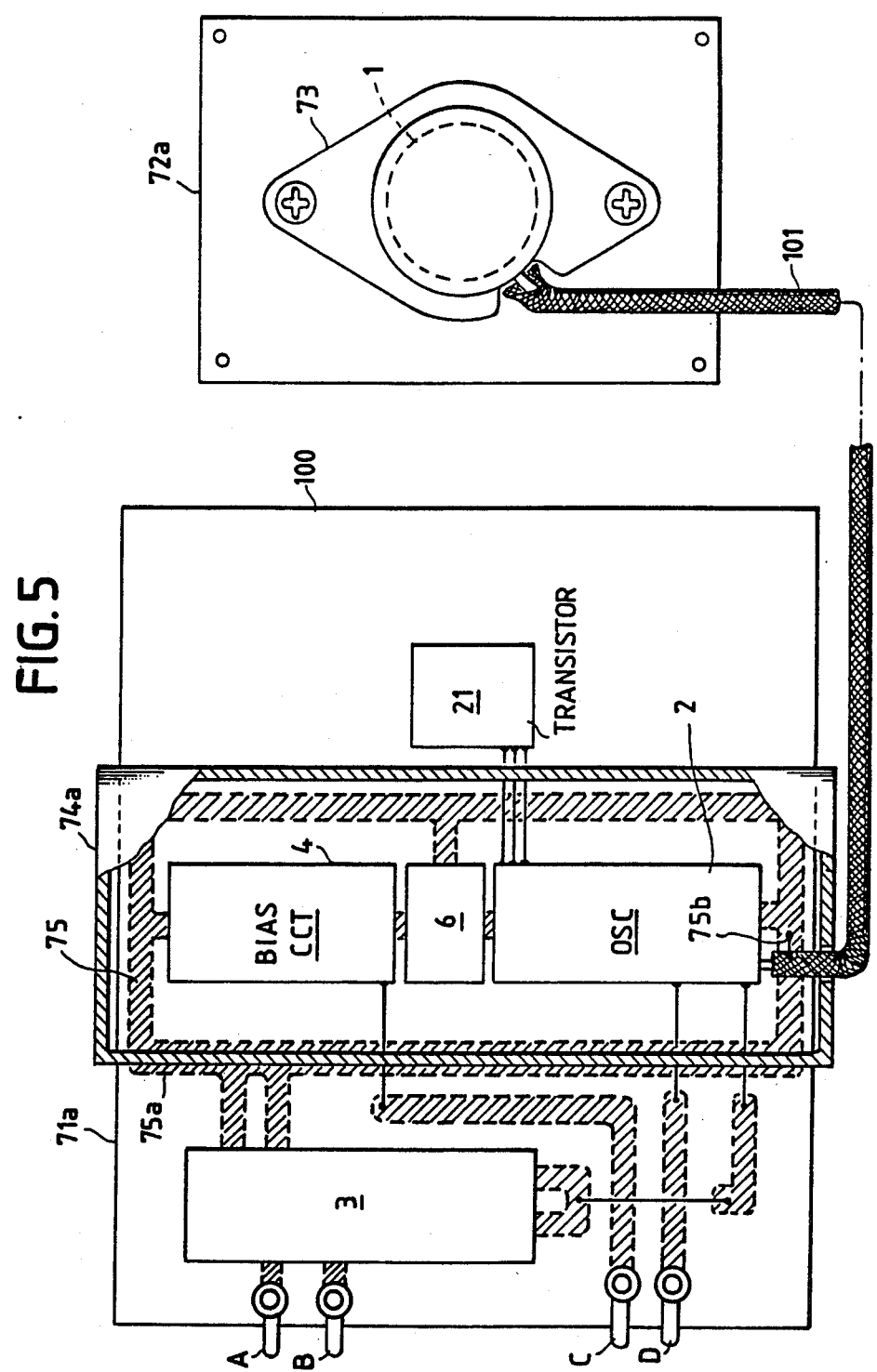
FIG. 5 is a plan view of an atomizer drive circuit in which the piezoelectric transducer is located remote from the oscillator.
Figure 6:
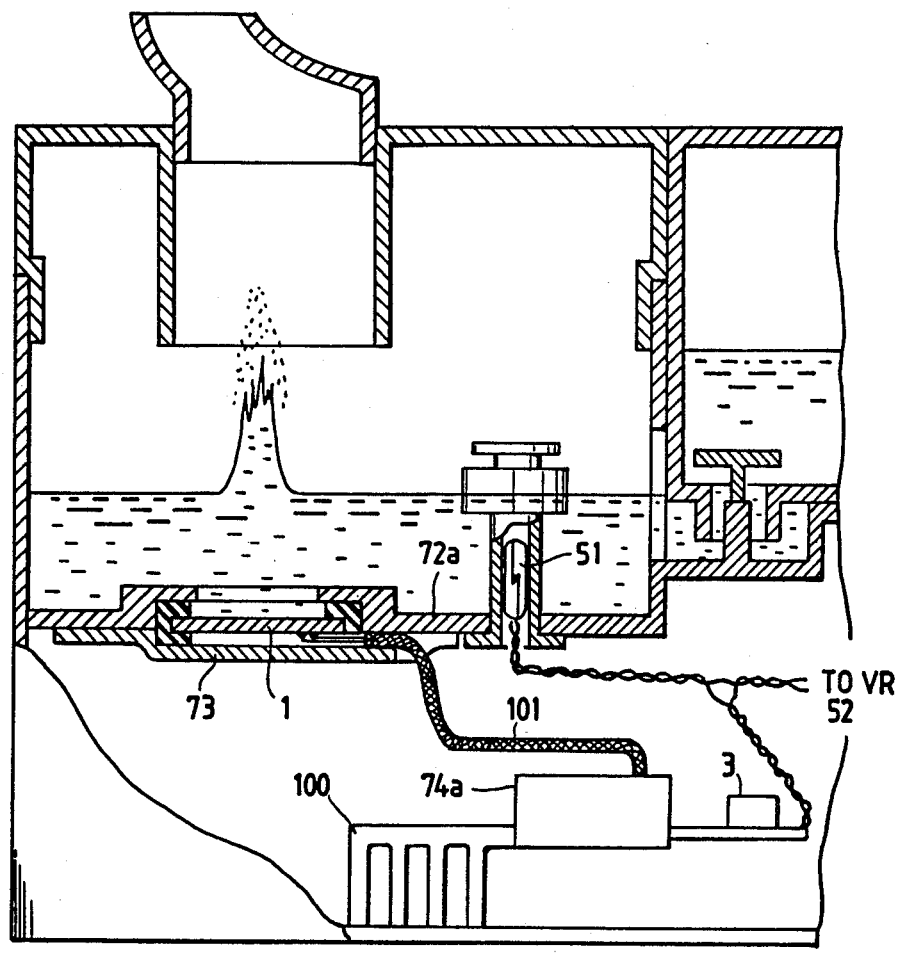
FIG. 6 is a view in cross-section of an atomizer unit incorporating the circuit of FIG. 5.

In FIG. 5, a transducer unit is shown separated from the printed circuit board to permit it to be located in a position remote from the atomizer drive circuit. This arrangement, which finds use in atomizers of the air-cooled type, differs from the previous embodiment in that it includes a head sink 100 having parallel fins, as seen in FIG. 6, which is air-cooled by a fan, not shown, and on which the transistor 21 is mounted in a heat transfer relationship thereto. Head sink 100 is connected to printed circuit board 71a as an extension therefrom and located outside of shield case 74a which encases the bias circuit 4, capacitor 6 and oscillator 2. Oscillator 2 and transducer 1 are electrically connected by means of a shielded pair of insulated wires 101. The shield of the wires has its one end coupled to the printed conductor 75 as at 75b, and the other end flattened and sandwiched between metal base 72a and transducer casing 73, a portion of which is broken to reveal the termination. Due to this connection, base 72a and casing 73 are maintained at the common ground potential and the connecting wires are shielded, thus minimizing radiation noise. As seen in FIG. 6, the transducer unit is secured to the bottom of the liquid chamber to maintain transducer 1 in pressure transfer relationship with the liquid. Because of the base 72a being at the common ground potential, the liquid is maintained at the same ground potential.

What is claimed is:

1. An apparatus comprising:
   an insulative substrate;
   a power circuit mounted on one surface of said substrate and connected to receive power from a mains supply and rectifying the AC energy of the supply and supplying the rectified energy to a pair of power lines;
   a high frequency source mounted on said one surface of the substrate and electrically connected to said power lines for converting said rectified energy into oscillation energy;
   a shield casing electrically connected to one of said power lines which is lower in impedance than the other power line and encasing said high frequency source; and
   a conductor printed on the other surface of said substrate and substantially aligned with a portion of the shield casing which is positioned between said power circuit and said high frequency source, said conductor being electrically connected to said one of the power lines.

2. An apparatus as claimed in claim 1, wherein said printed conductor is in the shape of a loop encircling a portion of the substrate in which said high frequency source is located.

3. An apparatus as claimed in claim 1, wherein said printed conductor includes a portion for feeding said rectified energy to said high frequency source.

4. An apparatus as claimed in claim 1, wherein said high frequency source comprises a bias circuit connected to said power circuit for generating a bias potential, a transistor having a control electrode connected to be responsive to said bias potential, a first controlled electrode connected to one of said power lines and a second controlled electrode, and a resonance circuit having inductive and capacitive components, the inductive component connecting the other power line to said second controlled electrode and the capacitive component being connected across said power lines, said printed conductor and said shield casing being connected to said first controlled electrode.

5. An apparatus as claimed in claim 4, further comprising a liquid chamber for holding liquid therein, a conductive support electrically connected to said printed conductor, an electromechanical transducer mounted on said conductive support in pressure transmitting relationship with the liquid for generating pressure rises therein in response to said oscillation energy, said transistor being mounted on said conductive support in heat transfer relationship thereto, the conductive support being in contact with said liquid.

6. An apparatus as claimed in claim 4, further comprising a liquid chamber for holding liquid therein, conductive support, an electromechanical transducer mounted in pressure transmitting relationship with the liquid, a shielded pair of wires for coupling said oscillation energy to said transducer, one end of the shield of the wires being electrically connected to said printed conductor and the other end thereof being electrically connected to said conductive support, and a heat sink on which said transistor is mounted in heat transfer relationship thereto to allow the sink to be cooled by air.

7. An atomizer comprising:
an insulative substrate;
a power circuit mounted in a first area of a first surface of the substrate, the power circuit being connected to receive power from a mains supply and rectifying the AC energy of the supply and supplying the rectified energy to a pair of power lines;
a bias circuit mounted in a second area of said first surface of the substrate, the bias circuit being connected to said power lines for generating a bias potential;
an oscillator mounted in said second area, the oscillator including a transistor responsive to said bias potential and a resonance load connected to said power lines and said transistor in an energy amplifying relationship for converting the rectified energy into oscillation energy;
a shield casing electrically connected to one of said power lines which is lower in impedance than the other power line and encasing said bias circuit and said oscillator;
a conductor printed on a second, opposite surface of said substrate, said conductor being substantially aligned with a portion of the shield casing which is positioned between said first and second areas, said conductor being electrically connected to said one of said power lines;
a liquid chamber for holding liquid therein;
a conductive support forming part of the bottom of said chamber, the conductive support being electrically connected to said one of the power lines; and
a piezoelectric transducer mounted on said conductive support in pressure transmitting relationship with said liquid for generating pressure rises therein in response to said oscillation energy;

8. An atomizer as claimed in claim 7, further comprising means for adjusting said bias potential, and a pair of terminals on said first area of the substrate for coupling the output of said bias circuit and said transistor to said bias adjusting means.

9. An atomizer as claimed in claim 8, further comprising means connected in series with said bias adjusting means for disconnecting the circuit between said bias circuit and said transistor when the surface of said liquid is below a predetermined level.

10. An atomizer as claimed in claim 7, wherein said conductive support, said piezoelectric transducer and said transistor are encased within said shield casing, said transistor being mounted on said conductive support in heat transfer relationship thereto.

11. An atomizer as claimed in claim 7, wherein said substrate is located in a position remote from said conductive support, further comprising a shielded pair of wires for applying said oscillation energy to said piezoelectric transducer, the shield of the wires being electrically connected at one end to said one of the power lines and at the other end to said conductive support, and a heat sink electrically connected to said one of the power lines, said transistor being mounted on said heat sink in heat transfer relationship thereto to allow it to be cooled by air.

12. An atomizer as claimed in claim 7, wherein said printed conductor is in the shape of a loop encircling a portion of the substrate in which said bias circuit and said oscillator are located.

13. An atomizer as claimed in claim 7, wherein said printed conductor includes a portion for feeding said rectified energy to said oscillator.

14. An atomizer as claimed in claim 7, wherein said transistor has a control electrode connected to be responsive to said bias potential, a first controlled electrode connected to said one of the power lines and a second controlled electrode, an inductive component of said resonance load connecting the other power line to said second controlled electrode and a capacitive component of the resonance load being connected across said power lines, said printed conductor and said shield casing being electrically connected to said first controlled electrode.

* * * * *